(12) United States Patent
Guo et al.

(10) Patent No.: US 12,306,225 B2
(45) Date of Patent: May 20, 2025

(54) METHOD FOR MEASURING DEGREE OF STABILITY OF GENERATOR AND POWER TRANSMISSION LINE, AND ELECTRICAL GRID CONTROL SYSTEM

(71) Applicant: HUANENG CLEAN ENERGY RESEARCH INSTITUTE, Beijing (CN)

(72) Inventors: Chen Guo, Beijing (CN); Zhaolei Wang, Beijing (CN); Chong Jiao, Beijing (CN); Xiaoyu Wang, Beijing (CN); Xin Liu, Beijing (CN); Liying Zhang, Beijing (CN); Anmin Cai, Beijing (CN)

(73) Assignee: HUANENG CLEAN ENERGY RESEARCH INSTITUTE, Beijing (CN)

( * ) Notice: Subject to any disclaimer, the term of this patent is extended or adjusted under 35 U.S.C. 154(b) by 793 days.

(21) Appl. No.: 17/501,880

(22) Filed: Oct. 14, 2021

(65) Prior Publication Data

US 2022/0043041 A1    Feb. 10, 2022

Related U.S. Application Data

(63) Continuation of application No. PCT/CN2020/121252, filed on Oct. 15, 2020.

(30) Foreign Application Priority Data

Dec. 31, 2019   (CN) .......................... 201911411792.0

(51) Int. Cl.
*G01R 21/133*   (2006.01)
*G01R 31/34*   (2020.01)
*H02J 13/00*   (2006.01)

(52) U.S. Cl.
CPC ......... *G01R 21/1331* (2013.01); *G01R 31/34* (2013.01); *H02J 13/00002* (2020.01)

(58) Field of Classification Search
CPC ........................ G01R 21/1331; G01R 31/34; G01R 19/2513; G01R 31/00; G01R 31/346;
(Continued)

(56) References Cited

U.S. PATENT DOCUMENTS

2017/0244347 A1* 8/2017 Garcia ...................... H02J 3/16
2022/0412312 A1* 12/2022 Yu ........................... H02J 3/381

OTHER PUBLICATIONS

PV Plant Modeling for power system integration using PSCAD software (Year: 2015).*

(Continued)

*Primary Examiner* — Mohamed Charioui
*Assistant Examiner* — Dacthang P Ngo
(74) *Attorney, Agent, or Firm* — Hodgson Russ LLP

(57) ABSTRACT

A stability measuring method for a synchronous generator includes: S11: collecting electrical quantities, and setting an alarm PQ curve of the synchronous generator; S12: calculating a dynamic reactive power reserve, an inductive dynamic reactive power reserve and a capacitive dynamic reactive power reserve of the synchronous generator; S13: calculating a dynamic reactive power reserve target value, an inductive dynamic reactive power reserve target value and a capacitive dynamic reactive power reserve target value of the synchronous generator; and S14: calculating a capacitive stability, an inductive stability and a stability of the synchronous generator.

14 Claims, 3 Drawing Sheets

(58) Field of Classification Search
CPC ...... H02J 13/00002; H02J 3/0012; H02J 3/16; H02J 3/38; H02J 3/46; H02J 3/24; Y02E 40/30; Y02E 60/00; Y04S 10/30
See application file for complete search history.

(56) References Cited

OTHER PUBLICATIONS

WIPO, International Search Report for International Application No. PCT/CN2020/121252, Jan. 15, 2021.

\* cited by examiner

METHOD FOR MEASURING DEGREE OF STABILITY OF GENERATOR AND POWER TRANSMISSION LINE, AND ELECTRICAL GRID CONTROL SYSTEM

CROSS-REFERENCE TO RELATED APPLICATIONS

This application is a continuation application of International Application No. PCT/CN2020/121252, filed Oct. 15, 2020, which is based upon and claims priority to Chinese Patent Application No. 201911411792.0, filed Dec. 31, 2019, the entire contents of which are incorporated herein by reference.

FIELD

The present disclosure relates to stability measuring and controlling methods and systems for a power plant, a transformer substation and a wide area power grid. Specifically, the present disclosure relates to accurate stability calculating and controlling methods for a power plant, a transformer substation and a wide area power grid and optimized controlling systems for stable operation of the power plant, the transformer substation and the wide area power grid, which provide a risk early warning to a power plant, a transformer substation and a wide area power grid with excessive low stability and disturbance risk.

BACKGROUND

With the rapid development of the international and national economy, the power industry has grown rapidly accordingly, and structures and operation modes of power grids have been optimized and adjusted continuously. However, the new power grid structure also has the following problems:
1. The proportion of new energy power generation capacity in the power grid is increasing, and the probability of sub-synchronous and super-synchronous oscillations in new energy power plants and transformer substations and connected power grids is also increasing.
2. The continuous increase in the number of ultra-high voltage controllable series compensation and ultra-high voltage DC transmission lines leads to increasing risks of sub-synchronous oscillation (SSO) and sub-synchronous resonance (SSR) in the connected power plants, and the problem of generator shaft torsional vibration is becoming more and more prominent.
3. Although secondary or primary equipment, such as a power system stabilizer (PSS), an automatic excitation regulator (AVR) and a sub-synchronous oscillation suppression device is installed on site, unstable conditions still occur:
    (1) When the grid voltage changes suddenly, the sub-synchronous or super-synchronous oscillation is more likely to occur due to a limited output of a new energy generator set and the voltage tracking mode of a static var generator (SVG), which will further cause a large-scale off-grid accidents of the generator set.
    (2) When the grid voltage changes suddenly, the regulation of an automatic regulation device of a large generator set is limited, which is easy to cause low-frequency oscillation.
    (3) The oscillation of a generator or an electric transmission line in a power plant or a transformer substation cannot be detected and handled in time, which may lead to the expansion of the accident, thereby reducing the stability of the power grid or affecting the power generation quality.

Wide area measurement systems (WAMS), subsynchronous oscillation monitoring devices, shafting torsional vibration monitoring and protection devices and other systems or equipment are used on site to monitor the low-frequency, sub-synchronous or super-synchronous oscillation of the power grid and protect the power grid by tripping.

Although these systems or equipment can monitor and analyze the oscillation state of the power grid and trip the oscillating generator or transmission line to prevent the expansion of the oscillation accident, the oscillation may occur again after the system is restored to operation, and works of strengthening the stability of the power grid and preventing the occurrence of oscillation sources have not been done well.

Compared with similar products of the existing wide area measurement system (WAWS), the present disclosure proposes optimized stability measuring methods and stability controlling systems for a generator, an electric transmission line, a power plant grid, a transformer substation grid and a wide area power grid, which have the following technical advantages.
1. Oscillation Prevention:

The stability of the power plant grid and the transformer substation grid is improved by optimized control, which can reserve sufficient adjustment space for the automatic stability regulation device in the power plant or the transformer substation, and ensure the automatic stability regulation device in the power plant and the transformer substation to effectively damp the oscillation when the voltage or frequency of the grid changes suddenly, thereby preventing the occurrence of disturbance sources caused by generator overshoot in an accident state.
2. Provision of a High and Low Voltage Traversal Technology for the Site:

Technical measures to improve the stability of the wide area power grid through optimized control can improve dynamic reactive power reserves of the power plant grid and the transformer substation grid, reduce the amplitude of voltage fluctuation in the power plant and the transformer substation during the voltage sudden change, enhance the mutual support of the dynamic reactive power reserves between the power plant and the transformer substation, restore the voltage stability to the greatest extent after the voltage sudden change, and reduce the probability of high and low voltage trips of auxiliary equipment in the power plant and the transformer substation and reduce the probability of high and low voltage off-grid of wind and solar generator sets.

SUMMARY

The present disclosure provides a stability measuring method for a generator, a stability measuring method for an electric transmission line, a power grid controlling system, and details are as follows.

A stability measuring method for a synchronous generator is provided, which includes the following steps sequentially:
    S11: collecting electrical quantities, and setting an alarm PQ curve of the synchronous generator;
    S12: calculating a dynamic reactive power reserve, an inductive dynamic reactive power reserve and a capacitive dynamic reactive power reserve of the synchronous generator;

S13: calculating a dynamic reactive power reserve target value, an inductive dynamic reactive power reserve target value and a capacitive dynamic reactive power reserve target value of the synchronous generator; and S14: calculating a capacitive stability, an inductive stability and a stability of the synchronous generator, in S13, the dynamic reactive power reserve target value, the inductive dynamic reactive power reserve target value and the capacitive dynamic reactive power reserve target value of the synchronous generator are calculated by:

calculating a segment length between a left intersection point of a horizontal line passing through a coordinated PQ point of the synchronous generator and the alarm PQ curve of the synchronous generator and a right intersection point of the horizontal line passing through the coordinated PQ point of the synchronous generator and the alarm PQ curve of the synchronous generator as the dynamic reactive power reserve target value of the synchronous generator;

calculating a segment length between the left intersection point of the horizontal line passing through the coordinated PQ point of the synchronous generator and the alarm PQ curve of the synchronous generator and the coordinated PQ point of the synchronous generator as the capacitive dynamic reactive power reserve target value of the synchronous generator; and calculating a segment length between the right intersection point of the horizontal line passing through the coordinated PQ point of the synchronous generator and the alarm PQ curve of the synchronous generator and the coordinated PQ point of the synchronous generator as the inductive dynamic reactive power reserve target value of the synchronous generator, and in S14, the capacitive stability, the inductive stability and the stability of the synchronous generator are calculated by:

calculating a percentage of the capacitive dynamic reactive power reserve of the synchronous generator accounting for the dynamic reactive power reserve target value of the synchronous generator as the capacitive stability of the synchronous generator;

calculating a percentage of the inductive dynamic reactive power reserve of the synchronous generator accounting for the dynamic reactive power reserve target value of the synchronous generator as the inductive stability of the synchronous generator; and calculating a percentage of the dynamic reactive power reserve of the synchronous generator accounting for the dynamic reactive power reserve target value of the synchronous generator as the stability of the synchronous generator.

Further, the electrical quantities collected in S11 include a stator current signal, a stator voltage signal, an exciting current signal and an exciting voltage signal of the synchronous generator, and a voltage signal of a bus of a power plant.

A stability measuring method for an electric transmission line is provided, which includes the following steps sequentially:

S31: collecting electrical quantities, and setting an alarm PQ curve of the electric transmission line;

S32: calculating a dynamic reactive power reserve, an inductive dynamic reactive power reserve and a capacitive dynamic reactive power reserve of the electric transmission line;

S33: calculating a dynamic reactive power reserve target value, an inductive dynamic reactive power reserve target value and a capacitive dynamic reactive power reserve target value of the electric transmission line; and S34: calculating a capacitive stability, an inductive stability and a stability of the electric transmission line, in S33, the dynamic reactive power reserve target value, the inductive dynamic reactive power reserve target value and the capacitive dynamic reactive power reserve target value of the electric transmission line are calculated by:

calculating a segment length between a left intersection point of a horizontal line passing through a coordinated PQ point of the electric transmission line and the alarm PQ curve of the electric transmission line and a right intersection point of the horizontal line passing through the coordinated PQ point of the electric transmission line and the alarm PQ curve of the electric transmission line as the dynamic reactive power reserve target value of the electric transmission line;

calculating a segment length between the left intersection point of the horizontal line passing through the coordinated PQ point of the electric transmission line and the alarm PQ curve of the electric transmission line and the coordinated PQ point of the electric transmission line as the capacitive dynamic reactive power reserve target value of the electric transmission line; and calculating a segment length between the right intersection point of the horizontal line passing through the coordinated PQ point of the electric transmission line and the alarm PQ curve of the electric transmission line and the coordinated PQ point of the electric transmission line as the inductive dynamic reactive power reserve target value of the electric transmission line, and in S34, the capacitive stability, the inductive stability and the stability of the electric transmission line are calculated by:

calculating a percentage of the capacitive dynamic reactive power reserve of the electric transmission line accounting for the dynamic reactive power reserve target value of the electric transmission line as the capacitive stability of the electric transmission line; stabilization calculating a percentage of the inductive dynamic reactive power reserve of the electric transmission line accounting for the dynamic reactive power reserve target value of the electric transmission line as the inductive stability of the electric transmission line; and calculating a percentage of the dynamic reactive power reserve of the electric transmission line accounting for the dynamic reactive power reserve target value of the electric transmission line as the stability of the electric transmission line.

Further, the electrical quantities collected in S31 include a current signal and a voltage signal of the electric transmission line, and a voltage signal of a bus of a transformer substation.

A stability measuring method for a power plant grid is provided, which includes the following steps sequentially:

S51: calculating a capacitive stability, an inductive stability, a stability, a dynamic reactive power reserve target value, an inductive dynamic reactive power reserve target value and a capacitive dynamic reactive power reserve target value of each synchronous generator in the power plant using the method as described in any embodiment above;

S52: determining a dynamic reactive power reserve target value, a capacitive dynamic reactive power reserve target value and an inductive dynamic reactive power reserve target value of the power plant;

S53: determining a capacitive stability, an inductive stability and a stability of the power plant; and S54: reporting the dynamic reactive power reserve target value, the capacitive dynamic reactive power reserve target value, the inductive dynamic reactive power reserve target value, the capacitive stability, the inductive stability and the stability of the power plant to a calculating module of a stability measuring and controlling system of a wide area power grid, in S52, the dynamic reactive power reserve target value of the power plant is a sum of the dynamic reactive power reserve target values of all synchronous generators in the power plant; the capacitive dynamic reactive power reserve target value of the power plant is a sum of the capacitive dynamic reactive power reserve target values of all synchronous generators in the power plant; and the inductive dynamic reactive power reserve target value of the power plant is a sum of the inductive dynamic reactive power reserve target values of all synchronous generators in the power plant; and in S53, the capacitive stability of the power plant is a minimum of the capacitive stabilities of all synchronous generators in the power plant; the inductive stability of the power plant is a minimum of the inductive stabilities of all synchronous generators in the power plant; and the stability of the power plant is a sum of the capacitive stability and the inductive stability of the power plant.

Further, the electrical quantities collected in S51 include a stator current signal, a stator voltage signal, an exciting current signal and an exciting voltage signal of each synchronous generator in the power plant, and a voltage signal of a bus of the power plant.

A stability measuring method for a transformer substation grid is provided, which includes the following steps sequentially:

S71: calculating a capacitive stability, an inductive stability, a stability, a dynamic reactive power reserve target value, an inductive dynamic reactive power reserve target value and a capacitive dynamic reactive power reserve target value of each electric transmission line in the transformer substation using the method as described in any embodiment above;

S72: determining a dynamic reactive power reserve target value, a capacitive dynamic reactive power reserve target value and an inductive dynamic reactive power reserve target value of the transformer substation;

S73: determining a capacitive stability, an inductive stability and a stability of the transformer substation; and S74: reporting the dynamic reactive power reserve target value, the capacitive dynamic reactive power reserve target value, the inductive dynamic reactive power reserve target value, the capacitive stability, the inductive stability and the stability of the transformer substation to a calculating module of a stability measuring and controlling system of a wide area power grid, in S72, the dynamic reactive power reserve target value of the transformer substation is a sum of the dynamic reactive power reserve target values of all electric transmission lines at a power source side of the transformer substation; the capacitive dynamic reactive power reserve target value of the transformer substation is a sum of the capacitive dynamic reactive power reserve target values of all electric transmission lines at the power source side of the transformer substation; and the inductive dynamic reactive power reserve target value of the transformer substation is a sum of the inductive dynamic reactive power reserve target values of all electric transmission lines at the power source side of the transformer substation;

in S73 the capacitive stability of the transformer substation is a minimum of the capacitive stabilities of all electric transmission lines at the power source side of the transformer substation; the inductive stability of the transformer substation is a minimum of the inductive stabilities of all electric transmission lines at the power source side of the transformer substation; and the stability of the transformer substation is a sum of the capacitive stability and the inductive stability of the transformer substation.

Further, the electrical quantities collected in S71 include a current signal and a voltage signal of each electric transmission line in the transformer substation, and a voltage signal of a bus of the transformer substation.

A stability measuring method for a wide area power grid is provided, which includes:

receiving a capacitive stability, an inductive stability and a stability of a power plant determined according to the method as described in any embodiment above;

receiving a capacitive stability, an inductive stability and a stability of a transformer substation determined according to the method as described in any embodiment above; and determining a capacitive stability, an inductive stability and a stability of the wide area power grid based on the capacitive stability, the inductive stability and the stability of the power plant and the capacitive stability, the inductive stability and the stability of the transformer substation, specifically, the capacitive stability, the inductive stability and the stability of the wide area power grid are determined by:

determining a minimum of the capacitive stabilities of the power plant and the transformer substation in the wide area power grid as the capacitive stability of the wide area power grid;

determining a minimum of the inductive stabilities of the power plant and the transformer substation in the wide area power grid as the inductive stability of the wide area power grid; and determining a sum of the capacitive stability and the inductive stability of the wide area power grid as the stability of the wide area power grid.

A stability controlling system of a power plant grid is provided, which includes: an electrical acquisition device; a monitoring device; a load regulating device; and a high-speed communication network. The high-speed communication network is configured to allow communicate a stability measuring and controlling system of the power plant grid with a calculating module of a stability measuring and controlling system of a wide area power grid. The load regulating device is configured to regulate a load of a generator. The electrical acquisition device and the monitoring device are configured to determine a dynamic reactive power reserve target value, a capacitive dynamic reactive power reserve target value, an inductive dynamic reactive power reserve target value, a capacitive stability, an inductive stability and a stability of a power plant according to the method as described in any embodiment above.

Further, the monitoring device is configured to select two pairs of synchronous generators for regulation based on operation conditions of all synchronous generators in the power plant if it is determined that the stability of the power plant grid is less than a preset minimum stability.

Specifically, the two pairs of synchronous generators are selected by:
S111: calculating an active power deviation rate and a reactive power deviation rate of each synchronous generator in the power plant, in which the active power deviation rate is a percentage of a difference between an active power target value and an active power of the synchronous generator divided by a rated capacity of the synchronous generator, and the reactive power deviation rate is a percentage of a difference between a reactive power target value and a reactive power of the synchronous generator divided by the rated capacity of the synchronous generator; and
S112: selecting a pair of synchronous generators $G_{A\ MIN}$ and $G_{A\ MAX}$ which have a minimum active power deviation rate and a maximum active power deviation rate, respectively, and selecting a pair of synchronous generators $G_{RA\ MIN}$ and $G_{RA\ MAX}$ which have a minimum reactive power deviation rate and a maximum reactive power deviation rate, respectively, for regulation.

Further, the pair of synchronous generators which have the minimum active power deviation rate and the maximum active power deviation rate respectively and the pair of synchronous generators which have the minimum reactive power deviation rate and the maximum reactive power deviation rate respectively are regulated by:
decreasing an active output of the synchronous generator $G_{A\ MIN}$ with the minimum active power deviation rate and decreasing an inductive reactive output of the synchronous generator $G_{RA\ MIN}$ with the minimum reactive power deviation rate; and
increasing an active output of the synchronous generator $G_{A\ MAX}$ with the maximum active power deviation rate and increasing an inductive reactive output of the synchronous generator $G_{RA\ MAX}$ with the maximum reactive power deviation rate.

Further, in a stability regulating process, a total active power and a total reactive power of the power plant are compared with respective total power target values, and power balance regulation to the whole power plant is performed when the following conditions are met:
decreasing the inductive reactive output of the synchronous generator $G_{RA\ MIN}$ with the minimum reactive power deviation rate or decreasing the active output of the synchronous generator $G_{A\ MIN}$ with the minimum active power deviation rate when the total reactive power or the total active power of the power plant is greater than the respective total power target value;
increasing the inductive reactive output of the synchronous generator $G_{RA\ MAX}$ with the maximum reactive power deviation rate or increasing the active output of the synchronous generator $G_{A\ MAX}$ with the maximum active power deviation rate when the total reactive power or the total active power of the power plant is less than the respective total power target value; and
stopping the power balance regulation to the whole power plant when a difference between the total reactive power and the respective total power target value of the power plant or a difference between the total active power and the respective total power target value of the power plant is in a preset range.

Further, in the regulating process, the total active power and the total reactive power of the power plant are kept to follow the respective total power target values.

The preset disclosure provides in embodiments a stability controlling system of a transformer substation grid, which includes: an electrical acquisition device; a monitoring device; a load regulating device; and a high-speed communication network. The high-speed communication network is configured to communicate a stability measuring and controlling system of the transformer substation grid with a calculating module of a stability measuring and controlling system of a wide area power grid. The load regulating device is configured to regulate a load of an electric transmission line. The electrical acquisition device and the monitoring device are configured to determine a dynamic reactive power reserve target value, a capacitive dynamic reactive power reserve target value, an inductive dynamic reactive power reserve target value, a capacitive stability, an inductive stability and a stability of the electric transmission line according to the method as described in any embodiment above.

Further, the monitoring device is configured to select a pair of electric transmission lines at a power source side which have a minimum active power deviation rate and a maximum active power deviation rate respectively and select a pair of electric transmission lines at the power source side which have a minimum reactive power deviation rate and a maximum reactive power deviation rate respectively for regulation, based on operation conditions of the electric transmission lines, and specifically, the two pairs of electric transmission lines are selected by:
S161: calculating an active power deviation rate and a reactive power deviation rate of each electric transmission line in a transformer substation, in which the active power deviation rate is a percentage of a difference between an active power target value and an active power of the electric transmission line divided by a rated capacity of the electric transmission line, and the reactive power deviation rate is a percentage of a difference between a reactive power target value and a reactive power of the electric transmission line divided by the rated capacity of the electric transmission line; and
S162: selecting the pair of electric transmission lines $L_{A\ MIN}$ and $L_{A\ MAX}$ at the power source side which have the minimum active power deviation rate and the maximum active power deviation rate, respectively, and selecting the pair of electric transmission lines $L_{RA\ MIN}$ and $L_{RA\ MAX}$ at the power source side which have the minimum reactive power deviation rate and the maximum reactive power deviation rate, respectively, for regulation.

Further, the pair of electric transmission lines at the power source side which have the minimum active power deviation rate and the maximum active power deviation rate respectively and the pair of electric transmission lines at the power source side which have the minimum reactive power deviation rate and the maximum reactive power deviation rate respectively are regulated by:
decreasing an active output of the electric transmission line $L_{A\ MIN}$ with the minimum active power deviation rate and decreasing an inductive reactive output of the electric transmission line $L_{RA\ MIN}$ with the minimum reactive power deviation rate; and increasing an active output of the electric transmission line $L_{A\ MAX}$ with the maximum active power deviation rate and increasing an inductive reactive output of the electric transmission line $L_{RA\ MAX}$ with the maximum reactive power deviation rate.

Further, in a stability regulating process, a total active power and a total reactive power of the transformer substation are compared with respective total power target values, and power balance regulation to the transformer substation is performed when the following conditions are met:

decreasing the inductive reactive output of the electric transmission line $L_{RA\ MIN}$ at the power source side with the minimum reactive power deviation rate or decreasing the active output of the electric transmission line $L_{A\ MIN}$ with the minimum active power deviation rate when the total reactive power or the total active power of the transformer substation is greater than the respective total power target value;

increasing the inductive reactive output of the electric transmission line $L_{RA\ MAX}$ at the power source side with the maximum reactive power deviation rate or increasing the active output of the electric transmission line $L_{A\ MAX}$ with the maximum active power deviation rate when the total reactive power or the total active power of the transformer substation is less than the respective total power target value; and stopping the power balance regulation to the transformer substation when a difference between the total reactive power and the respective total power target value of the transformer substation or a difference between the total active power and the respective total power target value of the transformer substation is in a preset range.

Further, in the regulating process, the total active power and the total reactive power of the transformer substation are kept to follow the respective total power target values.

A stability controlling system of a wide area power grid is provided, which includes: at least one of a stability controlling system of a power plant grid as described in any embodiment above and a stability controlling system of a transformer substation grid as described in any embodiment above; a stability calculating module of the wide area power grid; and a high-speed communication network. The high-speed communication network is configured to communicate with at least one of the stability controlling system of the power plant grid and the stability controlling system of the transformer substation grid. The stability calculating module of the wide area power grid is configured to calculate a stability of the wide area power grid using a stability measuring method for a wide area power grid as describe, and transmit total power target values of the power plant grid or the transformer substation grid and a regulating instruction of the wide area power grid to the stability controlling system of the power plant grid or the stability controlling system of the transformer substation grid through the high-speed communication network after the regulating instruction is determined.

Further, the stability calculating module of the wide area power grid determines the regulating instruction of the wide area power grid by:

S211: giving a minimum stability of the wide area power grid;

regulating the stability of the wide area power grid when the stability of the wide area power grid is less than the given minimum stability of the wide area power grid; and transmitting the regulating instruction to a power plant or a transformer substation with a minimum stability in the wide area power grid to increase the stability of the power plant or the transformer substation, and stopping regulation when the stability of the wide area power grid is greater than or equal to the given minimum stability.

Further, the regulation is optimized to equate dynamic reactive power reserve proportions of power plant grids and transformer substation grids in the wide area power grid.

REFERENCE NUMERALS

1—pivotal transformer substation; 2—stability measuring and controlling system for power plant and transformer substation grids; 3—wind power transformer substation; 4—power plant; 5—electric transmission line at a power source side of a transformer substation; 6—wind driven generator; 7—synchronous generator; 8—electric transmission line for a power plant or a transformer substation; 9—wide area power grid stability measuring and controlling module.

DETAILED DESCRIPTION

Figure 1:
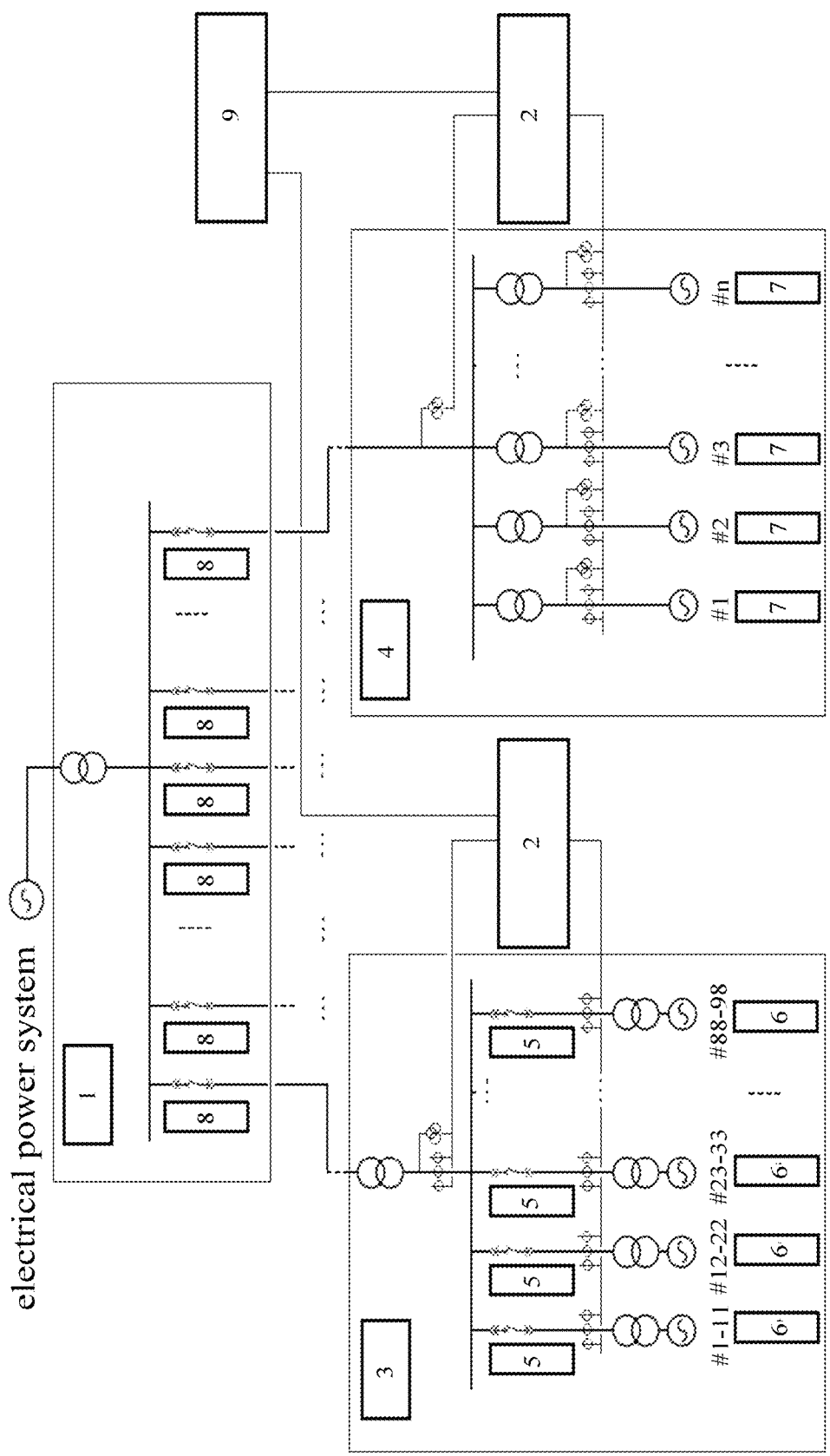
FIG. 1 is schematic module diagram showing composition of an electrical power system.

FIG. 1 is schematic module diagram showing composition of an electrical power system. In the electrical power system, there is a wide area power grid, which be composed of several wind power transformer substation grids 3 and several power plant grids 4. The wind power transformer substation and the power plant are each installed with a grid stability measuring and controlling system cabinet, which are connected with a stability measuring and controlling module of the wide area power grid via a high-speed communication network. In the electrical power system, stability measuring methods for a generator, an electric transmission line, a transformer substation and a power plant provided in the present disclosure are used to measure the respective stabilities of the generator, the electric transmission line, the transformer substation and the power plant, and controlling systems of a transformer substation grid, a power plant grid and a wide area power grid provided in the present disclosure are used to control the respective grid stabilities. In this way, problems presented in existing systems, such as excessive low stability of the power plant and the transformer substation and undetected disturbance risk, are overcame, and a risk early warning can be given to the abnormal stability of the wide area power grid.

The technical solutions involved in the present disclosure will be described in detail with reference to the drawings.

Figure 2:
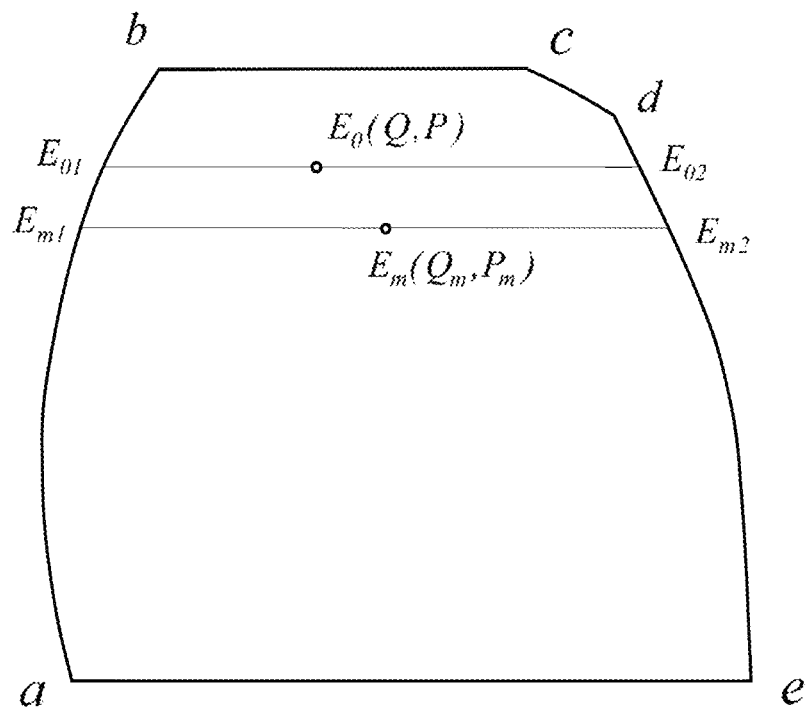
FIG. 2 is a schematic curve graph of a synchronous generator.

As shown in FIG. 2, a curve abcdea is an alarm PQ curve of a synchronous generator, in which a curve ab represents a low excitation limiting curve of the synchronous generator, a curve bc represents an active power limiting curve of the synchronous generator, a curve cd represents an overexcitation limiting curve limited by a maximum current and a maximum flux of a generator stator, a curve de represents an overexcitation limiting curve limited by a maximum working voltage and a maximum working current of a working exciter or a standby exciter of the synchronous generator, a maximum excitation voltage and a maximum excitation current of a generator rotor and a maximum excitation flux of the generator together, a curve ea represents a zero active curve of the synchronous generator, which is horizontal.

As shown in FIG. 2, a point $E_0$ (Q, P) represents an operating PQ point of the synchronous generator, where Q represents a reactive power of the synchronous generator, and P represents an active power of the synchronous generator.

Specifically, a dynamic reactive power reserve of the synchronous generator is calculated as a length of a segment $E_{01}E_{02}$ between a left intersection point $E_{01}$ of a horizontal line passing through the operating PQ point $E_0$ of the synchronous generator and the alarm PQ curve of the synchronous generator and a right intersection point $E_{02}$ of the horizontal line passing through the operating PQ point $E_0$ of the synchronous generator and the alarm PQ curve of the synchronous generator.

Specifically, a capacitive dynamic reactive power reserve of the synchronous generator is calculated as a length of a segment $E_{01}E_0$ between the left intersection point $E_{01}$ of the horizontal line passing through the operating PQ point $E_0$ of the synchronous generator and the alarm PQ curve of the synchronous generator and the operating PQ point $E_0$ of the synchronous generator.

Specifically, an inductive dynamic reactive power reserve of the synchronous generator is calculated as a length of a segment $E_0E_{02}$ between the right intersection point $E_{02}$ of the horizontal line passing through the operating PQ point $E_0$ of the synchronous generator and the alarm PQ curve of the synchronous generator and the operating PQ point $E_0$ of the synchronous generator.

A coordinated PQ point is calculated for each generator based on a total active power and a total reactive power of a power plant, rated parameters of each generator in the power plant and the alarm PQ curve of the generator in accordance with a rule of uniform reserve. When all generators are operated at their respective coordinated PQ points, the inductive dynamic reactive power reserve and the capacitive dynamic reactive power reserve of the whole plant are maximized.

As shown in FIG. 2, a point $E_m$ ($Q_m$, $P_m$) represents the coordinated PQ point of the synchronous generator, where $Q_m$ represents a reactive power target value of the synchronous generator, and $P_m$ represents an active power target value of the synchronous generator.

According to the above rule, a dynamic reactive power reserve target value, a capacitive dynamic reactive power reserve target value, and an inductive dynamic reactive power reserve target value of the synchronous generator may be determined.

Specifically, the dynamic reactive power reserve target value of the synchronous generator is calculated as a length of a segment $E_{m1}E_{m2}$ between a left intersection point $E_{m1}$ of a horizontal line passing through the coordinated PQ point $E_m$ of the synchronous generator and the alarm PQ curve of the synchronous generator and a right intersection point $E_{m2}$ of the horizontal line passing through the coordinated PQ point $E_m$ of the synchronous generator and the alarm PQ curve of the synchronous generator.

Specifically, the capacitive dynamic reactive power reserve target value of the synchronous generator is calculated as a length of a segment $E_{m1}E_m$ between the left intersection point $E_{m1}$ of the horizontal line passing through the coordinated PQ point $E_m$ of the synchronous generator and the alarm PQ curve of the synchronous generator and the coordinated PQ point $E_m$ of the synchronous generator.

Specifically, the inductive dynamic reactive power reserve target value of the synchronous generator is calculated as a length of a segment $E_mE_{m2}$ between the right intersection point $E_{m2}$ of the horizontal line passing through the coordinated PQ point $E_m$ of the synchronous generator and the alarm PQ curve of the synchronous generator and the coordinated PQ point $E_m$ of the synchronous generator.

Though the dynamic reactive power reserve target value, the capacitive dynamic reactive power reserve target value and the inductive dynamic reactive power reserve target value of the synchronous generator have different definitions and calculation methods, embodiments of the present disclosure only adopt the above-described calculation methods. It will be appreciated that other calculation methods can also be used for measuring the stability of a generator, an electric transmission line, a transformer substation and a power plant.

Specifically, a capacitive stability r/R of the synchronous generator is calculated as a percentage of the capacitive dynamic reactive power reserve $E_{01}E_0$ of the synchronous generator accounting for the dynamic reactive power reserve target value $E_{m1}E_{m2}$ of the synchronous generator:

$$\eta_R = \frac{E_{01}E_0}{E_{m1}E_{m2}} * 100\%.$$

Specifically, an inductive stability $\eta_G$ of the synchronous generator is calculated as a percentage of the inductive dynamic reactive power reserve $E_0E_{02}$ of the synchronous generator accounting for the dynamic reactive power reserve target value $E_{m1}E_{m2}$ of the synchronous generator:

$$\eta_G = \frac{E_0E_{02}}{E_{m1}E_{m2}} * 100\%.$$

Specifically, a stability $\eta$ of the synchronous generator is calculated as a percentage of the dynamic reactive power reserve $E_{01}E_{02}$ of the synchronous generator accounting for the dynamic reactive power reserve target value $E_{m1}E_{m2}$ of the synchronous generator:

$$\eta = \frac{E_{01}E_{02}}{E_{m1}E_{m2}} * 100\%.$$

Figure 3:
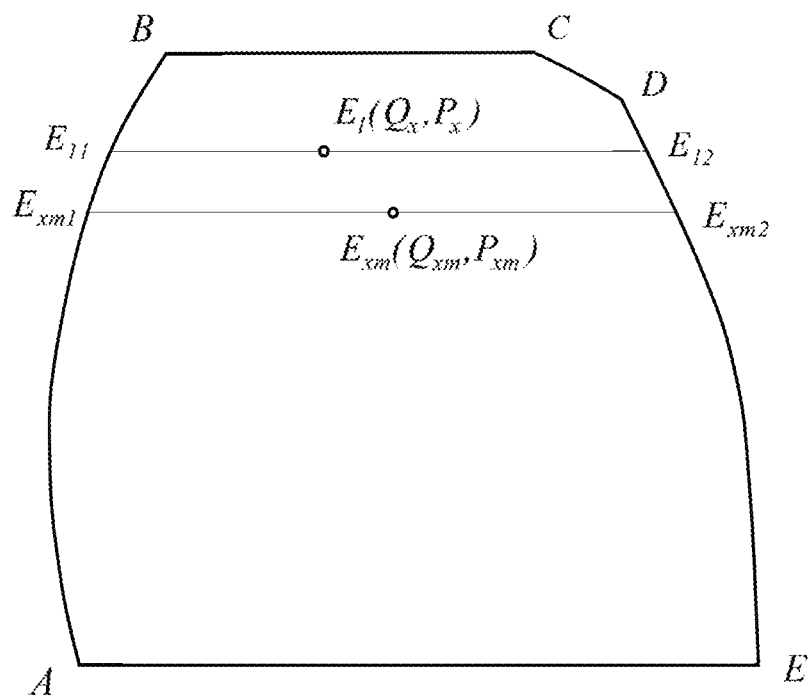
FIG. 3 is a schematic curve graph of an electric transmission line.

As shown in FIG. 3, a curve ABCDEA is an alarm PQ curve of an electric transmission line. A range enclosed by the ABCDEA curve is a maximum adjustable PQ range allowed by stability automatic regulating devices, such as an automatic excitation regulator (AVR) of a generator of a power plant connected to the electric transmission line, a power system stabilizer (PSS), a sub-synchronous disturbance excitation suppression device, a generator primary frequency adjustment device and the like, comprehensively considering a transmission capacity of the electric transmission line, an output allowed by the power plant connected to the electric transmission line and other factors. In the alarm PQ curve of the electric transmission line, a curve AE represents a zero active curve of the electric transmission line, which is horizontal.

As shown in FIG. 3, a point $E_1$ ($Q_x$, $P_x$) represents an operating PQ point of the electric transmission line, where $Q_x$ represents a reactive power of the electric transmission line, and $P_x$ represents an active power of the electric transmission line.

A dynamic reactive power reserve, a capacitive dynamic reactive power reserve and an inductive dynamic reactive power reserve of the electric transmission line may be calculated according to FIG. 3.

Specifically, the dynamic reactive power reserve of the electric transmission line is calculated as a length of a segment $E_{11}E_{12}$ between a left intersection point $E_{11}$ of a horizontal line passing through the operating PQ point $E_1$ of the electric transmission line and the alarm PQ curve of the electric transmission line and a right intersection point $E_{12}$ of the horizontal line passing through the operating PQ point $E_1$ of the electric transmission line and the alarm PQ curve of the electric transmission line.

Specifically, the capacitive dynamic reactive power reserve of the electric transmission line is calculated as a length of a segment $E_{11}E_1$ between the left intersection point $E_{11}$ of the horizontal line passing through the operating PQ point $E_1$ of the electric transmission line and the alarm PQ curve of the electric transmission line and the operating PQ point $E_1$ of the electric transmission line.

Specifically, the inductive dynamic reactive power reserve of the electric transmission line is calculated as a length of a segment $E_1E_{12}$ between the right intersection point $E_{12}$ of the horizontal line passing through the operating PQ point $E_1$ of the electric transmission line and the alarm PQ curve of the electric transmission line and the operating PQ point $E_1$ of the electric transmission line.

A coordinated PQ point is calculated for each electric transmission line at a power source side based on a total active power, a total reactive power and the alarm PQ curve of the electric transmission lines at the power source side in a transformer substation, in accordance with a rule of uniform reserve. When all electric transmission lines at the power source side in the transformer substation are operated at their respective coordinated PQ points, the inductive dynamic reactive power reserve and the capacitive dynamic reactive power reserve of the transformer substation are maximized.

As shown in FIG. 3, a point $E_{xm}$ ($Q_{xm}$, $P_{xm}$) represents the coordinated PQ point of the electric transmission line, where $Q_{xm}$ represents a reactive power target value of the electric transmission line, and $P_{xm}$ represents an active power target value of the electric transmission line.

According to the above rule, a dynamic reactive power reserve target value, a capacitive dynamic reactive power reserve target value, and an inductive dynamic reactive power reserve target value of the electric transmission line may be determined.

Specifically, the dynamic reactive power reserve target value of the electric transmission line is calculated as a length of a segment $E_{xm1}E_{xm2}$ between a left intersection point $E_{xm1}$ of a horizontal line passing through the coordinated PQ point $E_{xm}$ of the electric transmission line and the alarm PQ curve of the electric transmission line and a right intersection point $E_{xm2}$ of the horizontal line passing through the coordinated PQ point $E_{xm}$ of the electric transmission line and the alarm PQ curve of the electric transmission line.

Specifically, the capacitive dynamic reactive power reserve target value of the electric transmission line is calculated as a length of a segment $E_{xm1}E_{xm}$ between the left intersection point $E_{xm1}$ of the horizontal line passing through the coordinated PQ point $E_{xm}$ of the electric transmission line and the alarm PQ curve of the electric transmission line and the coordinated PQ point $E_{xm}$ of the electric transmission line.

Specifically, the inductive dynamic reactive power reserve target value of the electric transmission line is calculated as a length of a segment $E_{xm}E_{xm2}$ between the right intersection point $E_{xm2}$ of the horizontal line passing through the coordinated PQ point $E_{xm}$ of the electric transmission line and the alarm PQ curve of the electric transmission line and the coordinated PQ point $E_{xm}$ of the electric transmission line.

On the basis of the above calculated results, a capacitive stability, an inductive stability and a stability of the electric transmission line may be calculated, and the calculated results obtained thereby are uploaded to a stability measuring and controlling module of a wide area power grid.

Specifically, the capacitive stability $\eta_{xR}$ of the electric transmission line is calculated as a percentage of the capacitive dynamic reactive power reserve $E_{11}E_1$ of the electric transmission line accounting for the dynamic reactive power reserve target value $E_{xm1}E_{xm2}$ of the electric transmission line:

$$\eta_{xR} = \frac{E_{11}E_1}{E_{xm1}E_{xm2}} * 100\%.$$

Specifically, the inductive stability $\eta_{xG}$ of the electric transmission line is calculated as a percentage of the inductive dynamic reactive power reserve $E_1E_{12}$ of the electric transmission line accounting for the dynamic reactive power reserve target value $E_{xm1}E_{xm2}$ of the electric transmission line:

$$\eta_{xG} = \frac{E_1E_{12}}{E_{xm1}E_{xm2}} * 100\%.$$

Specifically, the stability $\eta$ of the electric transmission line is calculated as a percentage of the dynamic reactive power reserve $E_{11}E_{12}$ of the electric transmission line accounting for the dynamic reactive power reserve target value $E_{xm1}E_{xm2}$ of the electric transmission line:

$$\eta_x = \frac{E_{11}E_{12}}{E_{xm1}E_{xm2}} * 100\%.$$

After obtaining the stability and related data of the synchronous generator and the electric transmission line, a stability of a power plant grid and a stability of a transformer substation grid can be calculated and uploaded to the stability measuring and controlling module of the wide area power grid.

Specifically, a capacitive stability $\eta_{R,min}$ of the power plant grid is calculated by: comparing the capacitive stabilities $\eta_R$ of all synchronous generators in the power plant, and determining a minimum capacitive stability as the capacitive stability $\eta_{R,min}$ of the power plant grid.

Specifically, a inductive stability $\eta_{G,min}$ of the power plant grid is calculated by: comparing the inductive stabilities JG of all synchronous generators in the power plant, and determining a minimum inductive stability as the inductive stability $\eta_{G,min}$ of the power plant grid.

Specifically, the stability $\eta_{min}$ of the power plant grid is calculated as a sum of the capacitive stability $\eta_{R,min}$ and the inductive stability $\eta_{G,min}$ of the power plant grid:

$$\eta_{min} = \eta_{R.min} + \eta_{G.min}$$

Specifically, a capacitive stability $\eta_{xR,min}$ of the transformer substation grid is calculated by: comparing the capacitive stabilities $\eta_{xR}$ of all electric transmission lines at the power source side in the transformer substation grid, and determining a minimum capacitive stability as the capacitive stability $\eta_{xR,min}$ of the transformer substation grid.

Specifically, a inductive stability $\eta_{xG,min}$ of the transformer substation grid is calculated by: comparing the inductive stabilities $\eta_{xG}$ of all electric transmission lines at the power source side in the transformer substation grid, and determining a minimum inductive stability as the inductive stability $\eta_{xG,min}$ of the transformer substation grid.

Specifically, the stability $\eta_{x\ min}$ of the transformer substation grid is calculated as a sum of the capacitive stability and the inductive stability of the transformer substation grid:

$$\eta_{x\ min} = \eta_{xR.min} + \eta_{xG.min}$$

Besides the stabilities of the power plant and the transformer substation, respective capacitive dynamic reactive power reserve target values, inductive dynamic reactive power reserve target values and dynamic reactive power reserve target values of the power plant grid and the transformer substation grid can also be obtained by the above methods accordion to the present disclosure. For power plant grid, the capacitive dynamic reactive power reserve target value is a sum $\Sigma E_{m1}E_m$ of the capacitive dynamic reactive power reserve target values of all synchronous generators in the power plant; the inductive dynamic reactive power reserve target value is a sum $\Sigma E_m E_{m2}$ of the inductive dynamic reactive power reserve target values of all synchronous generators in the power plant; and the dynamic reactive power reserve target value is a sum $\Sigma E_{m1}E_{m2}$ of the dynamic reactive power reserve target values of all synchronous generators in the power plant. For the transformer substation grid, the capacitive dynamic reactive power reserve target value is a sum $\Sigma E_{xm1}E_{xm}$ of the capacitive dynamic reactive power reserve target values of all electric transmission lines at the power source side of the transformer substation; the inductive dynamic reactive power reserve target value is a sum $\Sigma E_{xm}E_{xm2}$ of the inductive dynamic reactive power reserve target values of all electric transmission lines at the power source side of the transformer substation; and the dynamic reactive power reserve target value is a sum $\Sigma E_{xm1}E_{xm2}$ of the dynamic reactive power reserve target values of all electric transmission lines at a power source side of the transformer substation.

In the wide area power grid, a capacitive stability $\eta_{wR}$ of the wide area power grid is determined by: comparing the capacitive stability $\eta_{R,min}$ of the power plant grid in the wide area power grid with the capacitive stability $\eta_{xR,min}$ of the transformer substation grid in the wide area power grid; and determining a minimum capacitive stability as the capacitive stability of the wide area power grid.

The inductive stability $\eta_{wG}$ of the wide area power grid is determined by: comparing the inductive stability $\eta_{G,min}$ of the power plant grid in the wide area power grid with the inductive stability $\eta_{xG,min}$ of the transformer substation grid in the wide area power grid; and determining a minimum inductive stability as the inductive stability of the wide area power grid.

The stability $\eta_w$ of the wide area power grid is determined is determined as a sum of the capacitive stability $\eta_{wR}$ and the inductive stability $\eta_{wG}$ of the wide area power grid:

$$\eta_w = \eta_{wR} + \eta_{wG}$$

Besides the determination of the stabilities of the generator, the electric transmission line, the power plant grid, the transformer substation grid and the wide area power grid, the present disclosure also provides a stability controlling system for the power plant grid, a stability controlling system for the transformer substation grid, and a stability controlling system for the wide area power grid.

In the stability controlling system for the power plant grid and the stability controlling system for the transformer substation grid, a minimum stability $\eta_{s\ min}$ is preset for the power plant grid and the transformer substation grid. If the stability of a measured grid is less than the preset minimum stability $\eta_{s\ min}$, it is necessary to carry out risk early warning and stability regulation for the measured grid. On the contrary, if the stability of the measured grid is greater than or equal to the preset minimum stability $\eta_{s\ min}$, it is unnecessary to regulate the stability of the measured grid.

For the power plant grid, an active power deviation rate $\Delta P$ of each synchronous generator in the power plant is calculated first. As shown in FIG. 2, the active power deviation rate of the synchronous generator is a percentage of a difference between an active power target value $P_m$ and an active power P of the synchronous generator divided by a rated capacity $S_N$ of the synchronous generator:

$$\Delta P = \frac{P_m - P}{S_N} * 100\%.$$

A reactive power deviation rate $\Delta Q$ of each synchronous generator in the power plant is calculated. As shown in FIG. 2, the reactive power deviation rate of the synchronous generator is a percentage of a difference between a reactive power target value $Q_m$ and a reactive power Q of the synchronous generator divided by a rated capacity of the synchronous generator:

$$\Delta Q = \frac{Q_m - Q}{S_N} * 100\%.$$

After $\Delta P$ and $\Delta Q$ are obtained, an active output and an inductive reactive output of the synchronous generator or the electric transmission line are regulated under the condition that a total active power and a total reactive power of the power plant are kept to follow respective total power target values. The specific regulations are as follows.

A pair of synchronous generators which have a minimum active power deviation rate and a maximum active power deviation rate are selected from all synchronous generators in the power plant, and regulated by: decreasing an active output of the synchronous generator with the minimum active power deviation rate and increasing an active output of the synchronous generator with the maximum active power deviation rate.

A pair of synchronous generators which have a minimum reactive power deviation rate and a maximum reactive power deviation rate are selected from all synchronous generators in the power plant, and regulated by: decreasing an inductive reactive output of the synchronous generator with the minimum reactive power deviation rate and increasing an inductive reactive output of the synchronous generator with the maximum reactive power deviation rate.

The total active power of the power plant is compared with a total active power target value, when $|\Sigma P-\Sigma P_C|>\Delta\Sigma P$ (where $\Sigma P$ represents the total active power of the power plant, $\Sigma P_c$ represents the total active power target value of the power plant, and $\Delta\Sigma P$ represents a preset value, which is a positive number, such as 20 MW), i.e., when a difference between the total active power and the total active power target value of the power plant exceeds a present range, active power balance regulation is performed to the whole power plant.

Specifically, when the total active power of the power plant is greater than the total active power target value of the power plant, the active output of the synchronous generator with the minimum active power deviation rate $\Delta P$ is decreased.

When total active power of the power plant is less than the total active power target value of the power plant, the active output of the synchronous generator with the maximum active power deviation rate $\Delta P$ is increased.

When the difference between the total active power and the total active power target value of the power plant is in the preset range, i.e., $|\Sigma P-\Sigma P_C|\leq\Delta\Sigma P$, the active power balance regulation to the whole power plant is stopped.

In the stability regulating process, the total reactive power of the power plant is compared with a total reactive power target value, when $|\Sigma Q-\Sigma Q_C|>\Delta\Sigma Q$ (where $\Sigma Q$ represents the total reactive power of the power plant, $\Sigma Q_c$ represents the total reactive power target value of the power plant, and $\Delta\Sigma Q$ represents a preset value, which is a positive number, such as 20 MVAR), i.e., when a difference between the total reactive power and the total reactive power target value of the power plant exceeds a present range, reactive power balance regulation is performed to the whole power plant.

Specifically, when the total reactive power of the power plant is greater than the total reactive power target value of the power plant, the inductive reactive output of the synchronous generator with the minimum reactive power deviation rate $\Delta Q$ is decreased.

When total reactive power of the power plant is less than the total reactive power target value of the power plant, the inductive reactive output of the synchronous generator with the maximum reactive power deviation rate $\Delta Q$ is increased.

When the difference between the total reactive power and the total reactive power target value of the power plant is in the preset range, i.e., $|\Sigma Q-\Sigma Q_C|\leq\Delta\Sigma Q$, the reactive power balance regulation to the whole power plant is stopped.

As a result of the optimized regulation, the active powers (P) and the reactive powers (Q) of all synchronous generators operate near their respective coordinated PQ points, and both the inductive dynamic reactive power reserve and the capacitive dynamic reactive power reserve of the whole power plant are maximized.

For the transformer substation grid, a similar processing way to that of the power plant grid may be used. The difference lies in that a basic processing unit of the transformer substation grid is the electric transmission line.

In the wide area power grid, the stability of the wide area power grid may be determined and controlled in accordance with the above method, the specific steps are as follows.

The total reactive power target value or the total active power target value are calculated for each power plant and each transformer substation in the wide area power grid according to a total active power and a total reactive power of the wide area power grid, rated parameters of the power plants and the transformer substations in the wide area power grid and the alarm PQ curve in accordance with a rule of uniform reserve. The total power target values ($\Sigma Q_c$, $\Sigma P_c$) are distributed to the power plants and the transformer substations. When all power plants and transformer substations operate at their respective total power target values, i.e., the PQ point, the inductive dynamic reactive power reserve and the capacitive dynamic reactive power reserve of the wide area power grid are maximized and the stability is maximized.

A dynamic reactive power reserve proportion am of each power plant in the wide area power grid is calculated as a percentage of the inductive dynamic reactive power reserve target value $\Sigma E_m E_{m2}$ of the power plant accounting for the capacitive dynamic reactive power reserve target value $\Sigma E_{m1} E_m$ of the power plant:

$$\alpha_m = \frac{\Sigma E_m E_{m2}}{\Sigma E_{m1} E_m} * 100\%.$$

A dynamic reactive power reserve proportion $a_{xm}$ of each transformer substation in the wide area power grid is calculated as a percentage of the inductive dynamic reactive power reserve target value $\Sigma E_{xm} E_{xm2}$ of the transformer substation accounting for the capacitive dynamic reactive power reserve target value $\Sigma E_{xm1} E_{xm}$ of the transformer substation:

$$\alpha_{xm} = \frac{\sum E_{xm} E_{xm2}}{\sum E_{xm1} E_{xm}} * 100\%.$$

A minimum stability $\beta_{min}$ is preset for the wide area power grid.

When the stability $\eta_w$ of the wide area power grid is less than the preset minimum stability $\beta_{min}$ of the wide area power grid, the stability of the wide area power grid is regulated by: transmitting a regulating instruction to the power plant or the transformer substation with a minimum stability in the wide area power grid to increase the stability of the power plant or the transformer substation, and stopping regulation when the stability of the wide area power grid is greater than or equal to the preset minimum stability.

An ultimate objective of the optimized regulation is to equate dynamic reactive power reserve proportions of the power plant grids and the transformer substation grids in the controlled wide area power grid, maximize the inductive dynamic reactive power reserve and the capacitive dynamic reactive power reserve of the wide area power grid, enable all synchronous generators of the power plant to operate at their respective coordinated PQ points, maximize the inductive dynamic reactive power reserve and the capacitive dynamic reactive power reserve of the whole power plant, enable all electric transmission lines of the transformer substation to operate at their respective coordinated PQ points, and maximize the inductive dynamic reactive power reserve and the capacitive dynamic reactive power reserve of the transformer substation.

Figure 4:
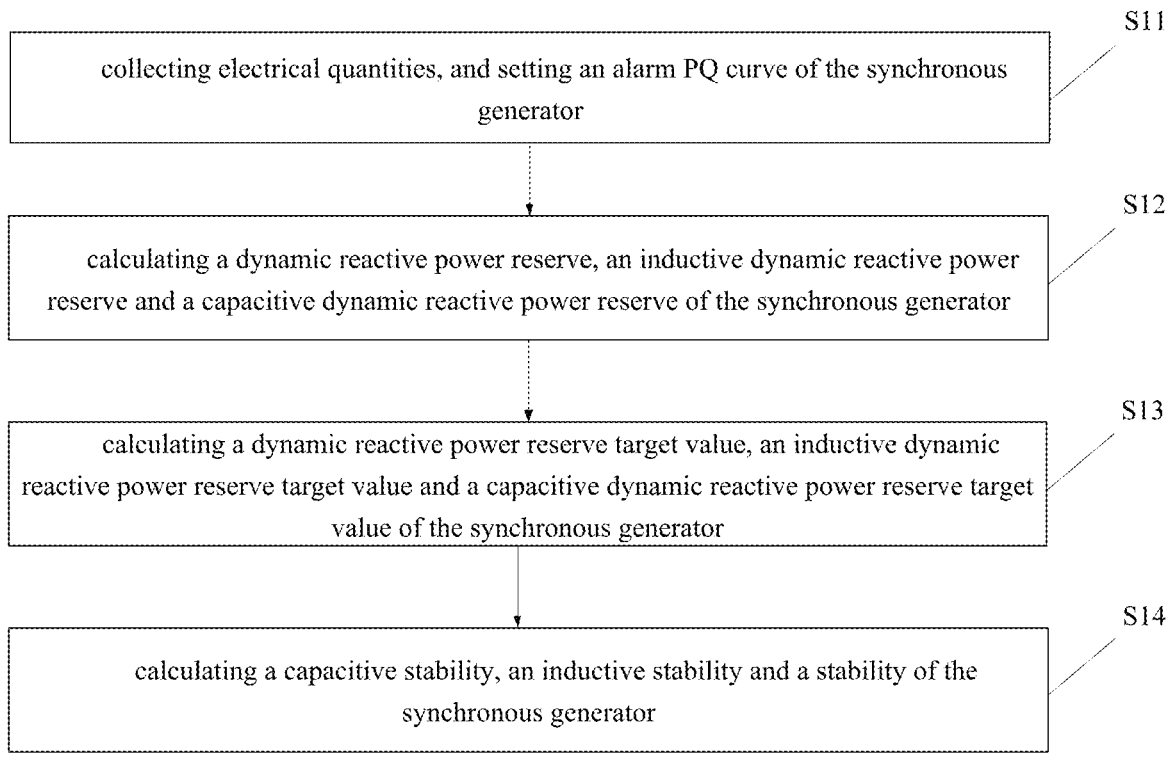
FIG. 4 is a flowchart of a stability measuring method for a synchronous generator.

As shown in FIG. 4, a stability measuring method for a synchronous generator is provided, which includes the following steps sequentially:

S11: collecting electrical quantities, and setting an alarm PQ curve of the synchronous generator;

S12: calculating a dynamic reactive power reserve, an inductive dynamic reactive power reserve and a capacitive dynamic reactive power reserve of the synchronous generator;

S13: calculating a dynamic reactive power reserve target value, an inductive dynamic reactive power reserve target value and a capacitive dynamic reactive power reserve target value of the synchronous generator; and S14: calculating a capacitive stability, an inductive stability and a stability of the synchronous generator.

Figure 5:
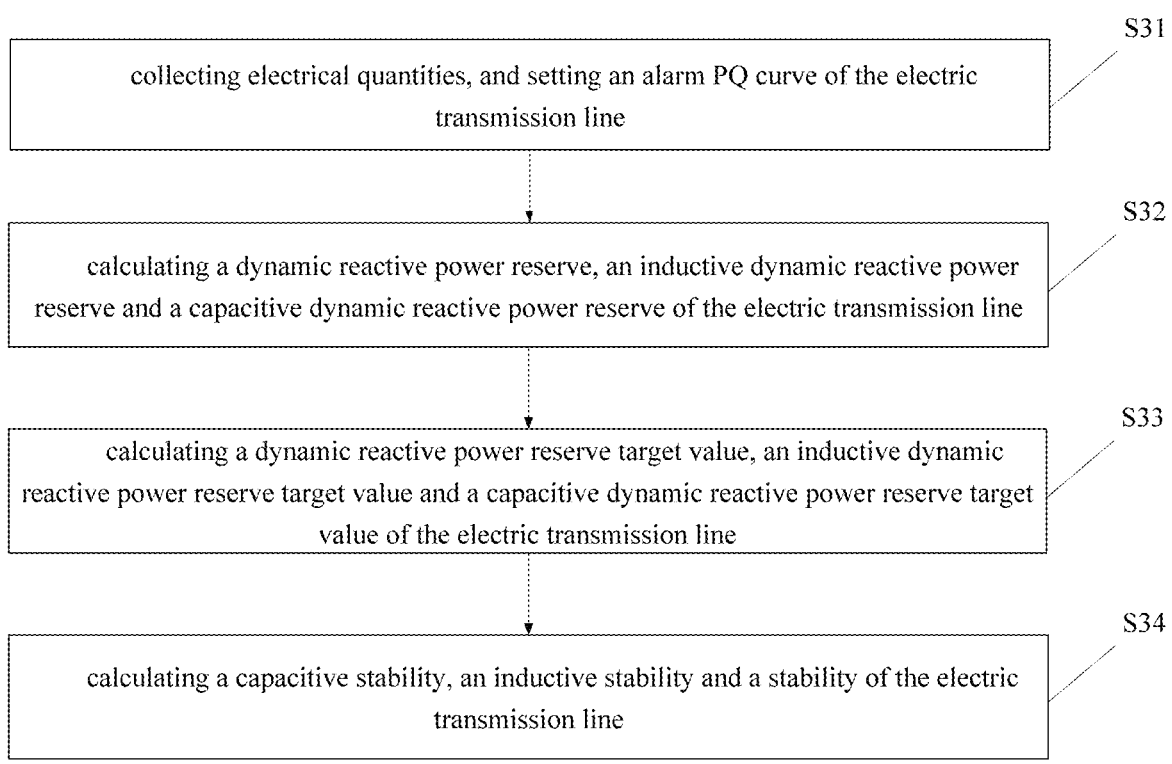
FIG. 5 is a flowchart of a stability measuring method for an electric transmission line.

As shown in FIG. 5, a stability measuring method for an electric transmission line is provided, which includes the following steps sequentially:

S31: collecting electrical quantities, and setting an alarm PQ curve of the electric transmission line;

S32: calculating a dynamic reactive power reserve, an inductive dynamic reactive power reserve and a capacitive dynamic reactive power reserve of the electric transmission line;

S33: calculating a dynamic reactive power reserve target value, an inductive dynamic reactive power reserve target value and a capacitive dynamic reactive power reserve target value of the electric transmission line; and S34: calculating a capacitive stability, an inductive stability and a stability of the electric transmission line.

The stability measuring method for the generator, the stability measuring method for the electric transmission line, the stability measuring method for the transformer substation, the stability measuring method for the power plant, the controlling system of the transformer substation grid, the controlling system of the power plant grid and the controlling system of the wide area power grid provided in the present disclosure are described in detail above, and the principle and embodiments of the present disclosure are illustrated herein through specific examples. It should be noted that the descriptions and illustrations of the above embodiments are merely for better understanding of the method and core idea of the present disclosure, and shall not be construed to limit the present disclosure. It would be appreciated by those ordinarily skilled in the art that changes and modifications can be made in the specific embodiments and application scopes in accordance with the spirit of the present disclosure.

What is claimed is:

1. A stability controlling system of a power plant grid, comprising:

an electrical acquisition device;

a monitoring device;

a load regulating device, configured to regulate a load of a generator; and a high-speed communication network, configured to communicate a stability measuring and controlling system of the power plant grid with a wide area measurement system of a wide area power grid, wherein the electrical acquisition device and the monitoring device are configured to determine a dynamic reactive power reserve target value, a capacitive dynamic reactive power reserve target value, an inductive dynamic reactive power reserve target value, a capacitive stability, an inductive stability and a stability of a power plant by:

S51: calculating a capacitive stability, an inductive stability, a stability, a dynamic reactive power reserve target value, an inductive dynamic reactive power reserve target value and a capacitive dynamic reactive power reserve target value of each synchronous generator in the power plant;

S52: determining the dynamic reactive power reserve target value, the capacitive dynamic reactive power reserve target value and the inductive dynamic reactive power reserve target value of the power plant;

S53: determining the capacitive stability, the inductive stability and the stability of the power plant; and S54: reporting the dynamic reactive power reserve target value, the capacitive dynamic reactive power reserve target value, the inductive dynamic reactive power reserve target value, the capacitive stability, the inductive stability and the stability of the power plant to the wide area measurement system for providing a risk early warning for the wide area power grid, wherein in S52, the dynamic reactive power reserve target value of the power plant is a sum of the dynamic reactive power reserve target values of all synchronous generators in the power plant; the capacitive dynamic reactive power reserve target value of the power plant is a sum of the capacitive dynamic reactive power reserve target values of all synchronous generators in the power plant; and the inductive dynamic reactive power reserve target value of the power plant is a sum of the inductive dynamic reactive power reserve target values of all synchronous generators in the power plant:

wherein in S53, the capacitive stability of the power plant is a minimum of the capacitive stabilities of all synchronous generators in the power plant: the inductive stability of the power plant is a minimum of the inductive stabilities of all synchronous generators in the power plant; and the stability of the power plant is a sum of the capacitive stability and the inductive stability of the power plant:

wherein calculating the capacitive stability, the inductive stability, the stability, the dynamic reactive power reserve target value, the inductive dynamic reactive power reserve target value and the capacitive dynamic reactive power reserve target value of each synchronous generator in the power plant comprises:

S11: collecting electrical quantities, and setting an alarm PQ curve of the synchronous generator:

S12: calculating a dynamic reactive power reserve, an inductive dynamic reactive power reserve and a capacitive dynamic reactive power reserve of the synchronous generator:

S13: calculating the dynamic reactive power reserve target value, the inductive dynamic reactive power reserve target value and the capacitive dynamic reactive power reserve target value of the synchronous generator:

S14: calculating the capacitive stability, the inductive stability and the stability of the synchronous generator; and providing the dynamic reactive power reserve, the inductive dynamic reactive power reserve and the capacitive dynamic reactive power reserve of the synchronous generator, and the dynamic reactive power reserve target value, the inductive dynamic reactive power reserve target value and the capacitive dynamic reactive power reserve target value of the synchronous generator to a power plant grid for improving a stability of the power plant grid, wherein in S13, the dynamic reactive power reserve target value, the inductive dynamic reactive power reserve target value and the capacitive dynamic reactive power reserve target value of the synchronous generator are calculated by:

calculating a segment length between a left intersection point of a horizontal line passing through a coordinated PQ point of the synchronous generator and the alarm PQ curve of the synchronous generator and a right intersection point of the horizontal line passing through the coordinated PQ point of the synchronous generator and the alarm PQ curve of the synchronous generator as the dynamic reactive power reserve target value of the synchronous generator;

calculating a segment length between the left intersection point of the horizontal line passing through the coordinated PQ point of the synchronous generator and the alarm PQ curve of the synchronous generator and the coordinated PQ point of the synchronous generator as the capacitive dynamic reactive power reserve target value of the synchronous generator; and calculating a segment length between the right intersection point of the horizontal line passing through the coordinated PQ point of the synchronous generator and the alarm PQ curve of the synchronous generator and the coordinated PQ point of the synchronous generator as the inductive dynamic reactive power reserve target value of the synchronous generator, and wherein in S14, the capacitive stability, the inductive stability and the stability of the synchronous generator are calculated by:

calculating a percentage of the capacitive dynamic reactive power reserve of the synchronous generator accounting for the dynamic reactive power reserve target value of the synchronous generator as the capacitive stability of the synchronous generator;

calculating a percentage of the inductive dynamic reactive power reserve of the synchronous generator accounting for the dynamic reactive power reserve target value of the synchronous generator as the inductive stability of the synchronous generator; and calculating a percentage of the dynamic reactive power reserve of the synchronous generator accounting for the dynamic reactive power reserve target value of the synchronous generator as the stability of the synchronous generator.

2. The stability controlling system according to claim 1, wherein the electrical quantities collected in S11 comprise a stator current signal, a stator voltage signal, an exciting current signal and an exciting voltage signal of the synchronous generator, and a voltage signal of a bus of a power plant.

3. The stability controlling system according to claim 1, wherein the electrical quantities collected in S51 comprise a stator current signal, a stator voltage signal, an exciting current signal and an exciting voltage signal of each synchronous generator in the power plant, and a voltage signal of a bus of the power plant.

4. The stability controlling system according to claim 1, wherein the monitoring device is configured to select two pairs of synchronous generators for regulation based on operation conditions of all synchronous generators in the power plant if it is determined that the stability of the power plant grid is less than a preset minimum stability, and wherein the two pairs of synchronous generators are selected by:

S111: calculating an active power deviation rate and a reactive power deviation rate of each synchronous generator in the power plant, wherein the active power deviation rate is a percentage of a difference between an active power target value and an active power of the synchronous generator divided by a rated capacity of the synchronous generator, and the reactive power deviation rate is a percentage of a difference between a reactive power target value and a reactive power of the synchronous generator divided by the rated capacity of the synchronous generator; and S112: selecting a pair of synchronous generators $G_{A\ MIN}$ and $G_{A\ MAX}$ which have a minimum active power deviation rate and a maximum active power deviation rate, respectively, and selecting a pair of synchronous generators $G_{RA\ MIN}$ and $G_{RA\ MAX}$ which have a minimum reactive power deviation rate and a maximum reactive power deviation rate, respectively, for regulation.

5. The stability controlling system according to claim 4, wherein the pair of synchronous generators which have the minimum active power deviation rate and the maximum active power deviation rate respectively and the pair of synchronous generators which have the minimum reactive power deviation rate and the maximum reactive power deviation rate respectively are regulated by:

decreasing an active output of the synchronous generator $G_{A\ MIN}$ with the minimum active power deviation rate and decreasing an inductive reactive output of the synchronous generator $G_{RA\ MIN}$ with the minimum reactive power deviation rate; and increasing an active output of the synchronous generator $G_{A\ MAX}$ with the maximum active power deviation rate and increasing an inductive reactive output of the synchronous generator $G_{RA\ MAX}$ with the maximum reactive power deviation rate.

6. The stability controlling system according to claim 5, wherein in a stability regulating process, a total active power and a total reactive power of the power plant are compared with respective total power target values, and power balance regulation to the whole power plant is performed when the following conditions are met:

decreasing the inductive reactive output of the synchronous generator $G_{RA\ MIN}$ with the minimum reactive power deviation rate or decreasing the active output of the synchronous generator $G_{A\ MIN}$ with the minimum active power deviation rate when the total reactive power or the total active power of the power plant is greater than the respective total power target value;

increasing the inductive reactive output of the synchronous generator $G_{RA\ MAX}$ with the maximum reactive power deviation rate or increasing the active output of the synchronous generator $G_{A\ MAX}$ with the maximum active power deviation rate when the total reactive power or the total active power of the power plant is less than the respective total power target value; and stopping the power balance regulation to the whole power plant when a difference between the total reactive power and the respective total power target value of the power plant or a difference between the total active power and the respective total power target value of the power plant is in a preset range.

7. The stability controlling system according to claim 1, wherein in the regulating process, the total active power and the total reactive power of the power plant are kept to follow the respective total power target values.

8. A stability controlling system of a transformer substation grid, comprising:
   an electrical acquisition device;
   a monitoring device;
   a load regulating device, configured to regulate a load of an electric transmission line; and
   a high-speed communication network, configured to communicate a stability measuring and controlling system of the transformer substation grid with a wide area measurement system of a wide area power grid,
   wherein the electrical acquisition device and the monitoring device are configured to determine a dynamic reactive power reserve target value, a capacitive dynamic reactive power reserve target value, an inductive dynamic reactive power reserve target value, a capacitive stability, an inductive stability and a stability of the electric transmission line by:
      S31: collecting electrical quantities, and setting an alarm PQ curve of the electric transmission line;
      S32: calculating a dynamic reactive power reserve, an inductive dynamic reactive power reserve and a capacitive dynamic reactive power reserve of the electric transmission line;
      S33: calculating the dynamic reactive power reserve target value, the inductive dynamic reactive power reserve target value and the capacitive dynamic reactive power reserve target value of the electric transmission line;
      S34: calculating the capacitive stability, the inductive stability and the stability of the electric transmission line; and
      providing the dynamic reactive power reserve target value, the inductive dynamic reactive power reserve target value and the capacitive dynamic reactive power reserve target value of the electric transmission line, and the capacitive stability, the inductive stability and the stability of the electric transmission line to a transformer substation grid for improving a stability of the transformer substation grid,
   wherein in S33, the dynamic reactive power reserve target value, the inductive dynamic reactive power reserve target value and the capacitive dynamic reactive power reserve target value of the electric transmission line are calculated by:
      calculating a segment length between a left intersection point of a horizontal line passing through a coordinated PQ point of the electric transmission line and the alarm PQ curve of the electric transmission line and a right intersection point of the horizontal line passing through the coordinated PQ point of the electric transmission line and the alarm PQ curve of the electric transmission line as the dynamic reactive power reserve target value of the electric transmission line;
      calculating a segment length between the left intersection point of the horizontal line passing through the coordinated PQ point of the electric transmission line and the alarm PQ curve of the electric transmission line and the coordinated PQ point of the electric transmission line as the capacitive dynamic reactive power reserve target value of the electric transmission line; and
      calculating a segment length between the right intersection point of the horizontal line passing through the coordinated PQ point of the electric transmission line and the alarm PQ curve of the electric transmission line and the coordinated PQ point of the electric transmission line as the inductive dynamic reactive power reserve target value of the electric transmission line, and
   wherein in S34, the capacitive stability, the inductive stability and the stability of the electric transmission line are calculated by:
      calculating a percentage of the capacitive dynamic reactive power reserve of the electric transmission line accounting for the dynamic reactive power reserve target value of the electric transmission line as the capacitive stability of the electric transmission line;
      calculating a percentage of the inductive dynamic reactive power reserve of the electric transmission line accounting for the dynamic reactive power reserve target value of the electric transmission line as the inductive stability of the electric transmission line; and
      calculating a percentage of the dynamic reactive power reserve of the electric transmission line accounting for the dynamic reactive power reserve target value of the electric transmission line as the stability of the electric transmission line.

9. The stability controlling system according to claim 8, wherein the electrical quantities collected in S31 comprise a current signal and a voltage signal of the electric transmission line, and a voltage signal of a bus of a transformer substation.

10. The stability controlling system according to claim 8, wherein the monitoring device is configured to select a pair of electric transmission lines at a power source side which have a minimum active power deviation rate and a maximum active power deviation rate respectively and select a pair of electric transmission lines at the power source side which have a minimum reactive power deviation rate and a maximum reactive power deviation rate respectively for regulation, based on operation conditions of the electric transmission lines if it is determined that the stability of the transformer substation grid is less than a preset minimum stability, and
   wherein the two pairs of electric transmission lines are selected by:
      S161: calculating an active power deviation rate and a reactive power deviation rate of each electric transmission line in a transformer substation, wherein the active power deviation rate is a percentage of a difference between an active power target value and an active power of the electric transmission line divided by a rated capacity of the electric transmission line, and the reactive power deviation rate is a percentage of a difference between a reactive power target value and a reactive power of the electric transmission line divided by the rated capacity of the electric transmission line; and
      S162: selecting the pair of electric transmission lines $L_{A\ MIN}$ and $L_{A\ MAX}$ at the power source side which have the minimum active power deviation rate and the maximum active power deviation rate, respectively, and selecting the pair of electric transmission lines $L_{RA\ MIN}$ and $L_{RA\ MAX}$ at the power source side which have the minimum reactive power deviation rate and the maximum reactive power deviation rate, respectively, for regulation.

11. The stability controlling system according to claim 10, wherein the pair of electric transmission lines at the power source side which have the minimum active power deviation rate and the maximum active power deviation rate respectively and the pair of electric transmission lines at the power source side which have the minimum reactive power deviation rate and the maximum reactive power deviation rate respectively are regulated by:

decreasing an active output of the electric transmission line $L_{A\ MIN}$ with the minimum active power deviation rate and decreasing an inductive reactive output of the electric transmission line $L_{RA\ MIN}$ with the minimum reactive power deviation rate; and increasing an active output of the electric transmission line $L_{A\ MAX}$ with the maximum active power deviation rate and increasing an inductive reactive output of the electric transmission line $L_{RA\ MAX}$ with the maximum reactive power deviation rate.

12. The stability controlling system according to claim 11, wherein in a stability regulating process, a total active power and a total reactive power of the transformer substation are compared with respective total power target values, and power balance regulation to the transformer substation is performed when the following conditions are met:

decreasing the inductive reactive output of the electric transmission line $L_{RA\ MIN}$ at the power source side with the minimum reactive power deviation rate or decreasing the active output of the electric transmission line $L_{A\ MIN}$ with the minimum active power deviation rate when the total reactive power or the total active power of the transformer substation is greater than the respective total power target value;

increasing the inductive reactive output of the electric transmission line $L_{RA\ MAX}$ at the power source side with the maximum reactive power deviation rate or increasing the active output of the electric transmission line $L_{A\ MAX}$ with the maximum active power deviation rate when the total reactive power or the total active power of the transformer substation is less than the respective total power target value; and stopping the power balance regulation to the transformer substation when a difference between the total reactive power and the respective total power target value of the transformer substation or a difference between the total active power and the respective total power target value of the transformer substation is in a preset range.

13. The stability controlling system according to claim 8, wherein in the regulating process, the total active power and the total reactive power of the transformer substation are kept to follow the respective total power target values.

14. A stability controlling system of a wide area power grid, comprising:

at least one of a stability controlling system of a power plant grid and a stability controlling system of a transformer substation grid;

a wide area measurement system of the wide area power grid; and a high-speed communication network, configured to communicate with at least one of the stability controlling system of the power plant grid and the stability controlling system of the transformer substation grid, wherein the wide area measurement system of the wide area power grid is configured to calculate a stability of the wide area power grid using a stability measuring method for a wide area power grid by determining a capacitive stability, an inductive stability and a stability of the wide area power grid based on a capacitive stability, an inductive stability and a stability of the power plant and a capacitive stability, an inductive stability and a stability of the transformer substation, and providing a risk early warning for the wide area power grid based on the capacitive stability, the inductive stability and the stability of the wide area power grid, and transmit total power target values of the power plant grid or the transformer substation grid and a regulating instruction of the wide area power grid to the stability controlling system of the power plant grid or the stability controlling system of the transformer substation grid through the high-speed communication network after the regulating instruction is determined, wherein the capacitive stability, the inductive stability and the stability of the wide area power grid are determined by:

determining a minimum of the capacitive stabilities of the power plant and the transformer substation in the wide area power grid as the capacitive stability of the wide area power grid;

determining a minimum of the inductive stabilities of the power plant and the transformer substation in the wide area power grid as the inductive stability of the wide area power grid; and determining a sum of the capacitive stability of the wide area power grid and the inductive stability of the wide area power grid as the stability of the wide area power grid, the wide area measurement system of the wide area power grid determines the regulating instruction of the wide area power grid by:

S211: giving a minimum stability of the wide area power grid;

regulating the stability of the wide area power grid when the stability of the wide area power grid is less than the given minimum stability of the wide area power grid; and transmitting the regulating instruction to a power plant or a transformer substation with a minimum stability in the wide area power grid to increase the stability of the power plant or the transformer substation, and stopping regulation when the stability of the wide area power grid is greater than or equal to the given minimum stability.

\* \* \* \* \*